United States Patent [19]

Fushimoto

[11] Patent Number: 4,652,976
[45] Date of Patent: Mar. 24, 1987

[54] ELECTRONIC EQUIPMENT
[75] Inventor: Hideo Fushimoto, Kawasaki, Japan
[73] Assignee: Canon Kabushiki Kaisha, Tokyo, Japan
[21] Appl. No.: 534,312
[22] Filed: Sep. 21, 1983
[30] Foreign Application Priority Data
  Sep. 30, 1982 [JP] Japan ................. 57-169840
[51] Int. Cl.[4] ............................. H05K 1/14
[52] U.S. Cl. .................. 361/413; 200/292; 339/4; 339/17 R; 361/394; 361/395; 361/415; 364/708
[58] Field of Search ............... 361/393, 394, 395, 399, 361/413, 415; 364/707, 708; 339/17 R, 18 R, 4; 200/292

[56] References Cited

U.S. PATENT DOCUMENTS

| 3,147,403 | 9/1964 | Cressman et al. | 361/394 X |
| 3,760,486 | 9/1973 | Rifkin et al. | 361/399 X |
| 3,808,506 | 4/1974 | Lang | 361/394 |
| 4,135,225 | 1/1979 | Welsch et al. | 361/394 X |
| 4,216,522 | 8/1980 | Slagel et al. | 339/17 X |
| 4,268,100 | 5/1981 | Kekas et al. | 361/415 X |
| 4,333,155 | 6/1982 | Johnston | 364/708 |
| 4,352,492 | 10/1982 | Smith | 361/415 X |
| 4,388,010 | 6/1983 | Mott et al. | 361/395 X |
| 4,454,552 | 6/1984 | Barnes et al. | 361/412 X |

FOREIGN PATENT DOCUMENTS 1449359  9/1976  United Kingdom ............. 339/18 R

OTHER PUBLICATIONS

Doody et al., Removable-Printed-Circuit Card and Contact Device, IBM Tech. Disc. Bull., vol. 16, #2, Jul. 1953, pp. 515 & 516.

Primary Examiner—R. R. Kucia
Attorney, Agent, or Firm—Fitzpatrick, Cella, Harper & Scinto

[57] ABSTRACT

An electronic device capable of removably mounting a memory card used as an external memory to a printed circuit board having a circuit pattern formed thereon comprises a memory card holder, a guide member which pivots the holder and has a biasing force imparted toward the circuit pattern of the printed circuit board, and locking means for locking the guide member when the guide member is spaced from the circuit pattern of the printed circuit board.

9 Claims, 7 Drawing Figures

ELECTRONIC EQUIPMENT

BACKGROUND OF THE INVENTION

1. Field of the Invention

The present invention relates to electronic equipment, and more particularly to an electronic equipment capable of detachably mounting a memory card which serves as an external memory for supplying a program or data.

2. Description of the Prior Art

In prior art electronic equipment such as an electronic computer having a program capability, a memory card having a predetermined program or data stored therein is mounted to the electronic equipment to expand functions of the electronic equipment. As a result, a user need not operate input keys to input the program or data and it is very convenient to the user.

Not only a ROM (read-only memory) card but also a readable and writable RAM (random access memory) card are used as the memory cards so that the user can store a new program or new data by key operation.

Accordingly, as compared to the ROM memory pack which allows the use of only prestored program or data, the RAM memory card can significantly expand the functions of the equipment.

On the other hand, in order to input the program or data from the memory card to the equipment and write the new program or data from the equipment to the memory card, it is necessary to contact a plurality of circuit patterns provided on the memory card to a plurality of contacts provided on the equipment one for each of the plurality of circuit patterns in order to exchange signals therebetween.

In order to connect the contacts of the memory card to the contacts of the circuit patterns, it is usual to extend a printed circuit board from the memory card, arrange an edge connector on the electronic equipment and fit them to each other to attain electrical connection. In this method, however, the circuit patterns are worn by the repetitive insertion and removal and the signals are not properly transmitted.

SUMMARY OF THE INVENTION

It is an object of the present invention to provide electronic equipment which prevents wear of electrical contacts of the electronic equipment and a memory card.

It is another object of the present invention to provide electronic equipment which is easy to mount and remove a memory card to the electronic equipment.

It is other object of the present invention to provide electronic equipment having a memory card holder at a portion of the electronic equipment and a guide plate arranged in the holder, the guide plate being rotatable in a direction of a printed circuit board on which circuit patterns are formed.

The other objects of the present invention will be apparent from the following description of the invention.

DETAILED DESCRIPTION OF THE PREFERRED EMBODIMENTS

Figure 1:
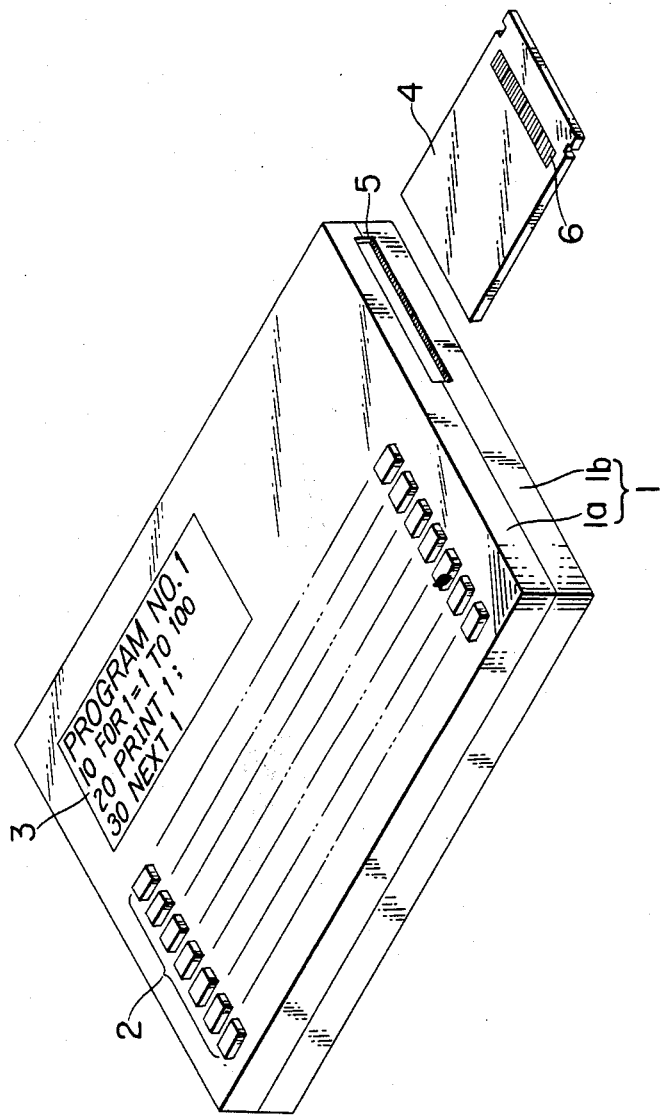
FIG. 1 is an overall perspective view of one embodiment of electronic equipment of the present invention.

FIGS. 1 to 7 illustrate one embodiment of the present invention. Numeral 1 denotes an electronic device or electronic equipment such as an electronic desk-top calculator. It comprises an upper case 1a and a lower case 1b, which are assembled in a unit by bolts or the like.

A front half of an upper surface of the upper case 1a is a keyboard area 2. A program or data is entered by depressing selected keys.

A rear half of the upper surface of the upper case 1a is a display area in which a display 3 for displaying electronic device or input data or an operation result is arranged.

An opening 5 through which a memory card 4 is inserted is formed on a side of the electronic equipment 1 over the upper and lower cases 1a and 1b.

The memory card 4 has a plurality of circuit patterns 6 formed thereon to allow signal exchange with the electronic equipment 1 and it also contains a ROM, and RAM and a power supply for backing up the RAM.

Figure 3:
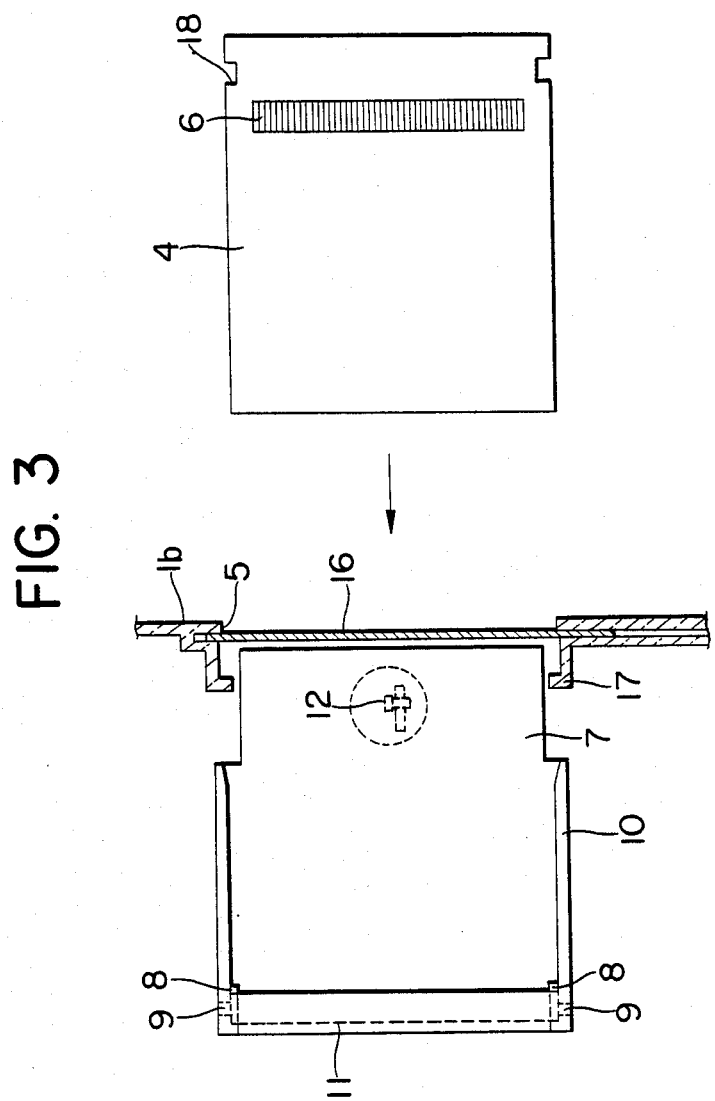
FIG. 3 is an enlarged cross-sectional view of a major portion.

A guide plate 7 is pivotably mounted in the upper and lower cases such that an inner end of the guide plate 7 is pivoted to a top end of a post 8 by a pin 9. As shown in FIG. 3, the guide plate 7 is slightly larger than the memory card 4 and has guide ribs 10 on both sides thereof.

A stopper 11 is integrally formed with the inner edge of the guide plate 7 to position the memory card horizontally and vertically.

A lift mechanism 12 is arranged at a free end of the guide plate 7. A detail of the lift mechanism 12 will be explained later.

Numeral 13 denotes a printed circuit board on which various arithmetic circuit devices are mounted to form an arithmetic circuit. The keyboard 2 is arranged on the upper surface of the printed circuit board 13.

Fixed to the printed circuit board 13 is a press-contact type connector 15 having a plurality of pins embedded therein for press-contact connection with the plurality of circuit patterns 6 on the memory card 4.

The opening 5 is provided with a horizontally slidable cover 16 which extends over the upper and lower cases 1a and 1b.

A guide rib 17 is formed inside of the opening 5 of the upper case 1a. It is fitted to a notch 18 formed in the memory card 4 so that the memory card 4 is completely accommodated in the guide plate 7 and perfectly positioned thereby.

The lift mechanism 12 is constructed as shown in FIGS. 4–7.

A stem 12a of the lift mechanism 12 is vertically slidable within a body 19 and has a flange 20 which also functions as a stopper. A coiled spring 21 is loaded between a lower surface of the flange 20 and a bottom of the body 19 to impart upward sliding force to the stem 12a. A guide projection 22 which is generally heart shaped and a projection 23 which is generally of an inverted triangle shape are vertically arranged on a side of a lower portion of the stem 12a.

A connecting rod 25 which is generally U-shaped is provided at the bottom of the body 19 with a lower end thereof pivoted to an aperture 24.

When the stem 12a is pushed down, the upper end of the connecting rod 25 fits into a recess above the projection 22 so that it suppresses upward movement of the stem 12a against the spring force of the coiled spring 21.

When the stem 12a is further pushed down, the upper end of the connecting rod 25 abuts against the circumference of the projection 23 and is deflected sideward. As a result, it is disengaged from the projection 22 and its position changes from FIG. 6 to FIG. 7. Thus, the stem 12a is pushed upward by the spring force of the coiled spring 21.

Figure 5:
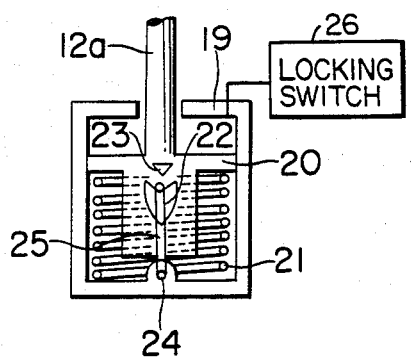
FIGS. 5-7 are longitudinal sectional views for illustrating a lift mechanism.
Figure 6:
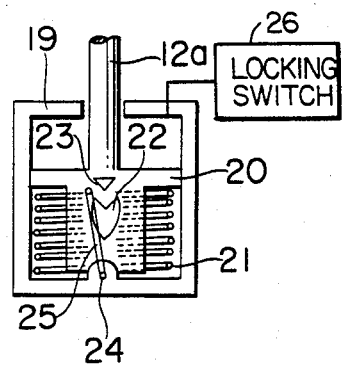
Figure 7:
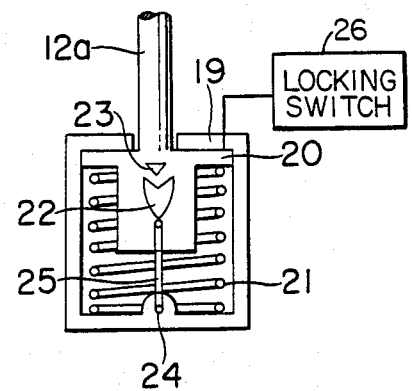

When the stem 12a is further pushed down from the position shown in FIG. 7, the connecting rod 25 is guided along the circumference of the heart-shaped projection 22 and engages with the heart-shaped projection 22 as shown in FIG. 5. Thus, the descended position is maintained.

The operation of the present embodiment is described below.

Figure 2:
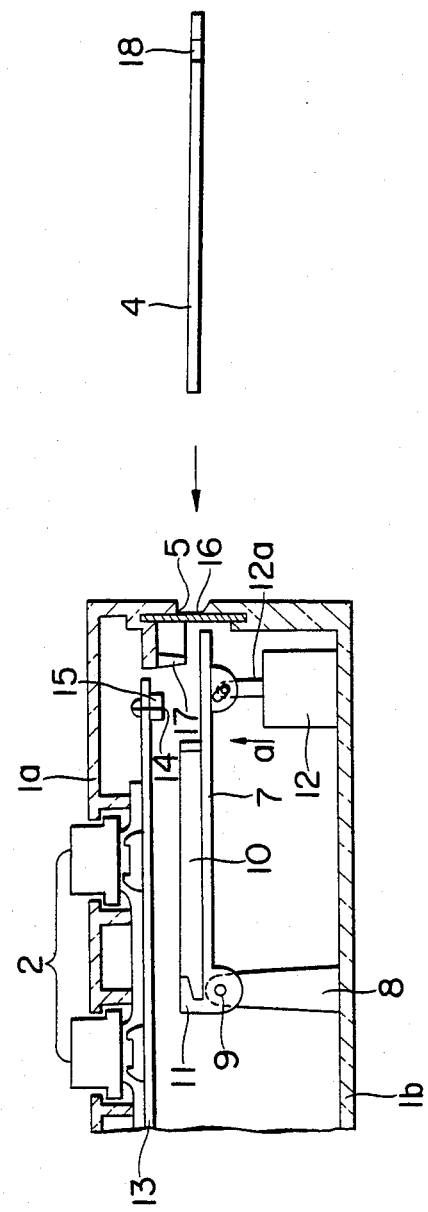
FIG. 2 is an enlarged sectional view of a major portion.

Before the memory card 4 is mounted, the lift mechanism 12 is at the pushed-down position and the guide plate 7 is substantially horizontal as shown in FIG. 2.

The cover 16 is opened and the memory card 4 is inserted through the opening 5 onto the guide plate 7 and pushed in until the leading edge thereof abuts against the stopper 11.

Figure 4:
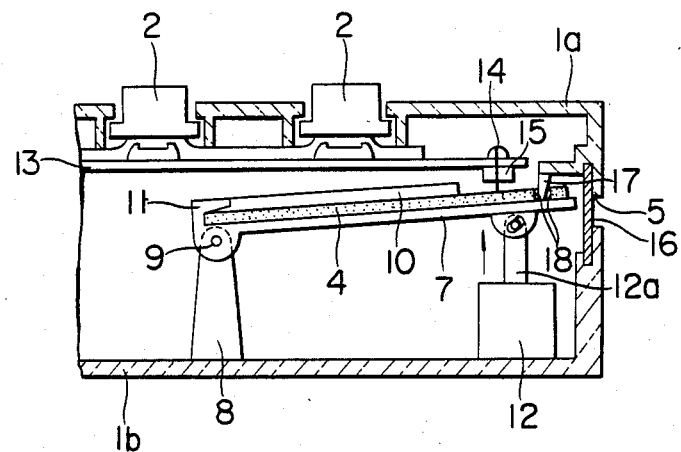
FIG. 4 is an enlarged sectional view when a memory card is mounted.

Then, the memory card 4 is pushed down. Thus, the stem 12a changes the position from FIG. 5 to FIG. 6 thence to FIG. 7. The stem 12a is moved upward by the spring force of the coiled spring 21 and the contact patterns 6 of the memory card 4 contact the press-contact type connector 15 as shown in FIG. 4 and are electrically connected through the pins 14.

When the memory card 4 is to be removed, the guide plate 7 is pushed down through the memory card 4. Thus, the stem 12a is held at the descended position as shown in FIG. 5 and the guide plate 7 is held horizontally. Thus, the memory card 4 can be removed from the opening 5.

In accordance with the present embodiment, the memory card is not slid to the contact patterns and hence the contact patterns are not worn.

As a motive force to the guide plate 7, a well-known locking switch 26 may be used. By turning off the locking switch when the stem 12a is pushed down and turning on the switch when the stem 12a is lifted, the connector is rendered to the off state when the memory card is not inserted by the action of the switch. Thus, even if a conductive foreign material comes into contact with the connector, the break of the circuit of the equipment is prevented.

When the guide plate 7 is at the upper position, the locking switch is turned on and the connector is rendered to the on state so that it can be electrically connected to the memory card.

As described hereinabove, according to the present invention, the memory card holder having the slidable cover is provided at the portion of the electronic equipment, and the guide plate which is pivotable in the direction of the press-contact type connector arranged above the guide plate is arranged in the holder and the guide plate is locked while it is away from the press-contact type connector. Accordingly, the contacts of the memory card are not worn.

What is claimed is:

1. Electronic equipment capable of removably mounting a memory card having a circuit pattern, the equipment comprising:
    a printed circuit board having electronic devices mounted thereon and having a circuit pattern formed thereon in electrical connection with said electronic devices;
    holding means having a major surface for removably accommodating the memory card on said major surface for electrical connection of the circuit pattern of the memory card with said circuit pattern of said printed circuit board;
    support means pivotably supporting one end of said holding means for rotation substantially perpendicularly to said major surface thereof;
    connecting means at the other end of said holding means for applying a force for moving said holding means about said support means in the direction substantially perpendicular to said major surface of said holding means between an enabled position to electrically connect the circuit pattern of a memory card accommodated by said holding means and said circuit pattern of said printed circuit board by the force applied to said holding means by said connecting means and a disabled position to electrically disconnect the circuit patterns of the memory card and said printed circuit board and enable removal of the memory card from said holding means; and
    switch means for supplying power to said circuit pattern of said printed circuit board when said holding means is in said enabled position and for interrupting power to said circuit pattern of said printed circuit board when said holding means is in said disabled position.

2. Electronic equipment according to claim 1, wherein a press-contact type connector having pins embedded therein for press-contact with the circuit pattern on a memory card is fixed to said circuit pattern of said printed circuit board.

3. Electronic equipment according to claim 1, wherein said holding means includes a stopper for positioning a memory card accommodated by said holding means.

4. Electronic equipment according to claim 1, wherein said connecting means includes a flange connected to said other end of said holding means, a spring for pushing said flange, and locking means for locking said flange against the pushing force of said spring when said holding means is in said disabled position and unlocking said flange when said holding means is in said enabled position.

5. Electronic equipment capable of electrically connecting a circuit pattern on a removable memory card to a circuit pattern on a printed circuit board mounted to the equipment, the equipment comprising:
    a case;
    a holder formed at a portion of said case for removably accommodating the memory card on a major surface of said holder;
    a guide member mounted to said holder for moving said holder in the direction substantially perpendicular to said major surface of said holder and having a biasing force imparted toward the circuit pattern of the printed circuit board to electrically connect the circuit patterns of the circuit board and the memory card by the biasing force imparted by said guide member;

locking means for locking said guide member while said holder is away from the circuit pattern of the printed circuit board to enable removal of the memory card from said holder; and switch means for interrupting power to the circuit pattern on the printed circuit board when said guide member is locked by said locking means.

6. Electronic equipment according to claim 5, wherein said case includes a slidable cover for providing access to said holder.

7. Electronic equipment according to claim 5, wherein said guide member has a stopper for positioning the memory card.

8. Electronic equipment according to claim 5, wherein said locking means includes a flange connected to one end of said guide member, a spring for pushing said flange and a latch member for latching said flange against the pushing force of said spring when said guide member is away from the circuit pattern of the printed circuit board and unlatching said flange to permit said guide member to move toward the circuit pattern of the printed circuit board.

9. Electronic equipment capable of electrically connecting a circuit pattern on a removable memory card to a circuit pattern on a printed circuit board mounted to the equipment, the equipment comprising:

a memory card holder having one end thereof pivotably supported and having a major surface for removably accommodating the memory card;

pressing means arranged at the other end of said memory card holder, said pressing means being slidable in the direction substantially perpendicular to said major surface of said memory card holder for continuously pressing said memory card holder toward the circuit pattern of the printed circuit board, wherein said pressing means can be enabled for associating the memory card with the printed circuit board to electrically connect the circuit patterns of the circuit board and the memory card by the force applied by said pressing means and disabled for disassociating the memory card from the printed circuit board to enable removal of the memory card from said memory card holder; and switch means for supplying power to the circuit pattern of the printed circuit board when said pressing means is enabled and interrupting power to the circuit pattern of the printed circuit board when said pressing means is disabled.

* * * * *